United States Patent [19]
Reid et al.

[11] Patent Number: 4,585,991
[45] Date of Patent: Apr. 29, 1986

[54] SOLID STATE MULTIPROBE TESTING APPARATUS

[75] Inventors: Lee R. Reid, Plano; Tommy D. Cody, Garland, both of Tex.

[73] Assignee: Texas Instruments Incorporated, Dallas, Tex.

[21] Appl. No.: 710,959

[22] Filed: Mar. 13, 1985

Related U.S. Application Data

[63] Continuation of Ser. No. 384,453, Jun. 3, 1982, abandoned.

[51] Int. Cl.$^4$ .................. G01R 31/26; G01R 1/04
[52] U.S. Cl. ..................... 324/158 P; 156/647; 324/73 PC
[58] Field of Search ............... 174/68.5; 361/406; 324/158 P, 158 F, 73 PC; 156/647

[56] References Cited

U.S. PATENT DOCUMENTS

| | | | |
|---|---|---|---|
| 3,436,605 | 4/1969 | Landron, Jr. | 174/68.5 X |
| 3,453,545 | 7/1969 | Oates | 324/158 P |
| 3,581,151 | 5/1978 | Boyle et al. | 357/15 |
| 3,781,596 | 12/1973 | Galli et al. | 361/409 X |
| 3,963,986 | 6/1976 | Morton et al. | 324/158 F |
| 3,984,620 | 10/1976 | Robillard et al. | 324/158 F |

FOREIGN PATENT DOCUMENTS 54-40082  3/1979  Japan .................... 29/574

OTHER PUBLICATIONS

W. Anacker, "Low Inductance Testor Probe for Low Temperature Application", IBM Tech. Disc. vol. 22, No. 6, Nov. 1979, p. 2518.

L. A. Gladstein et al., "Low Force Microcircuit Probe", IBM Tech. Disc. vol. 22, No. 7, Dec. 1979, pp. 2824–2826.

J. Schick, "Electrical Contact Through an SiO$_2$ Overlay by Ultrasonic Probe", IBM Tech. Disc. vol. 17, No. 11, Apr. 1975, pp. 3288–3289.

H. P. Byrnes et al., "Pad Deformation Contactor", in IBM Tech Disc. Bulletin vol. 21, No. 11, Apr. 1979, pp. 4511–4512.

R. A. Jaruela et al., "Stacked High–Density Multichip Module", in IBM Tech. Disc. Bulletin vol. 14, No. 10, Mar. 1972, pp. 2896–2897.

Anacker, W., et al., "Fabrication of Multiprobe Miniature Electrical Connector", IBM Technical Disclosure Bull., vol. 19, No., Jun. 1976, pp. 372–374.

Primary Examiner—Stewart J. Levy
Assistant Examiner—Stephen M. Baker
Attorney, Agent, or Firm—Carlton H. Hoel; Robert O. Groover; James T. Comfort

[57] ABSTRACT

A high density multiprobe including a multiprobe on a semiconductor substrate with contact pads selectively positioned in relation to the contacts of a device to be tested. Each of the selectively positioned contacts on the multiprobe semiconductor substrate include an elevated conductive surface that makes physical and electrical contact with the contacts of the device to be tested. In addition, the elevated conductive surfaces on the multiprobe are conductively connected to interface terminals on the semiconductor substrate to allow test signals to be input and output from the multiprobe device during testing. The multiprobe semiconductor substrate is also capable of containing onboard circuitry including buffers and logic circuitry for processing the test signals to be sent to and received from the device under test. A multiprobe testing device is also disclosed that includes the multiprobe semiconductor substrate with elevated contacts to allow for the testing of a semiconductor device.

39 Claims, 26 Drawing Figures

SOLID STATE MULTIPROBE TESTING APPARATUS

This application is a continuation of application Ser. No. 384,453, filed 06/03/82, now abandoned.

BACKGROUND

1. Field of the Invention

This invention relates to a multiprobe test system and specifically to a multiprobe test system utilizing a semiconductor substrate containing multiple elevated contact tips.

2. Description of Prior Art

In the formation of the electronics circuits, integrated circuits may be fabricated from thin semiconductor slices having a multiplicity of matrices or microcircuits thereon. The general practice is for each slice to contain a multiple of identical repeating matrices of the same type of microcircuits. The individual unit or circuit is sometimes referred to as an integrated circuit chip or an individual bar.

Before distribution, the present practice is to test each of the circuits of the integrated circuit chip on a slice or wafer prior to separating the slice into the desired integrated circuit components or combinations thereof.

Since each microcircuit or integrated circuit of each wafer is normally positioned in a predetermined, precise relation with respect to adjacent circuit units, it is possible to test the circuitry if probes can be accurately located on each of the preselected points that correspond to circuits to be tested. It is then possible, for example, to test several different circuits at the same time on any one integrated circuit.

In the test procedure there are several obstacles to overcome in order to have reliable testing without damaging the slice. In addition, with the increased complexity of modern integrated circuits, the large number of probes are required to perform adequate tests.

One approach to this problem is a multiprobe test system disclosed in U.S. Pat. No. 4,195,259 by Lee R. Reid. A multiprobe test system was described for testing microcircuits which included a printed circuit board having a plurality of data-detector probes attached for Z axis control and edge detection. A four-quadrant multiprobe edge sensor system was disclosed in U.S. Pat. No. 4,219,771 by Lee R. Reid and Chares R. Ratliff. This system included a printed circuit board having a plurality of data probes mounted thereon which include four data detector probes to detect positioning.

As integrated circuits become more complex, the number of probes required to test these circuits become more numerous. The circuits are also required to operate at higher speeds which introduce several new problems, such as lead inductance and stray capacitance. In addition, the probe needle tip positioning becomes critically sensitive. This invention discloses a technique to interconnect a large number of probes to a relatively small integrated circuit area. The fabrication of multiprobes in a miniature electrical connector are disclosed in the *IBM Technical Disclosure Bulletin*, "Fabrication of Multiprobe Miniature Electrical Connector", Vol. 19, No. 1, dated June 1976. This article discloses an electrical connector between two silicon wafers that are bonded together having cavities that are filled together with a metal which is liquid at a desired temperature. This type of system was adapted for use in the IBM Josephson System disclosed in *Electronics*, Nov. 3, 1981, page 40. I/O connections were made to Josephson chips by flexible ribbon cables that included a bottom edge of micropins that plug into mercury-filled wells on a socket. This configuration is only operable, however, at 4.2 degrees Kelvin.

Another technique for forming elevated bumps on semiconductor material is disclosed in U.S. Pat. No. 4,182,781 entitled, "Low Cost Method for Forming Elevated Metal Bumps on Integrated Circuit Bodies Employing an Aluminum/Paladium Metallization Base for Electroless Plating" by Robert C. Hooper, et al.

This invention employs the use of elevated contact tips produced by orientation dependent etching of the silicon substrate. A similar etching technique has been disclosed in the article entitled, "High Performance Heat Sinking for VLSI", by D. B. Tuckerman and R. F. Pease in the *IEEE Electron Device Letters*, Vol. EDL-2, No. 5, published May 1981. This article discloses a method of producing high performance heat sinks where 50 micrometer wide channels with 50 micrometer wide walls were etched vertically using an orientation dependent etch in (110) silicon wafers. The orientation etch of a wafer at the (110) plane results in a series of vertical walls extending from the surface of the wafer.

SUMMARY OF THE INVENTION

In accordance with the present invention, a probe is disclosed that includes several elevated conductive contact surfaces selectively positioned on a semiconductor substrate. These elevated conductive surfaces are conductively connected to signal interface terminals upon the substrate. These signal interface terminals are available for sending and receiving test signals to and from external test devices.

In one embodiment, a probe is disclosed that includes elevated conductive surfaces placed upon selectively positioned contact pads on a semiconductor substrate. The elevated conductive surfaces are etched from silicon and may be either metal coated or conductive silicon. These elevated surfaces are conductively connected to signal interface terminals upon the substrate. The elevated conductive surfaces are dielectrically isolated from the semiconductor substrate itself. The actual physical structure of the elevated conductive surface provides the electrical conductivity connection to any areas upon the semiconductor substrate such as signal interface terminals. The physical construction of the elevated conductive surfaces upon a electrically isolated surface, such as by dielectric isolation, also provides vertical flexibility when the probe makes contact with the device under test. Support backup mounted on the side of the semiconductor substrate opposite from the elevated conductive surfaces provides additional support to the probe. In addition, the semiconductor substrate may include logic and buffer circuitry on the semiconductor substrate to process and interface with test signals to be sent to and received from the device under test. The onboard circuitry can include plated-through holes formed by orientation dependent etching or other methods that allow circuitry to be mounted on either side of the probe semiconductor substrate. Further included is a mechanical capability to cause a vibration in the probe when the probe comes into contact with the device under test. This allows the elevated conductive surfaces to physically pierce any oxide layers that may have accumulated on the device under test.

Also in accordance with the present invention, a multiprobe tester is disclosed that includes the capability to position a multiprobe semiconductor substate upon a device under test. Preferably, the device under test would be another semiconductor substrate. The semiconductor multiprobe would include elevated contact surface conductive surfaces that would make contact with signal pads on the device under test. The multiprobe would provide test signals to the device under test and would receive test signals from the device under test. In one preferred embodiment, the tester would include circuitry to receive, to generate the test signals to the test device and receive the test signal results from the test device and evaluate the signals to determine if the device under test has passed or failed the test.

BRIEF DESCRIPTION OF THE DRAWINGS

The novel features believed characteristic of this invention are set forth in the appended claims. The invention itself, however, as well as other features and advantages thereof will be best understood by reference to the detailed description which follows read in conjunction with the accompanying drawings wherein:

DESCRIPTION OF THE INVENTION

Figure 1:
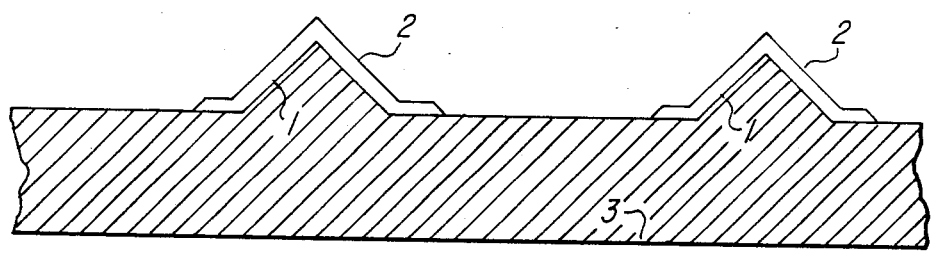
FIG. 1 is a cross sectional view of a semiconductor substrate with tips formed on a semiconductor substrate surface.

This disclosure relates to the structure of semiconductor substrates containing integrated circuits. FIG. 1 illustrates a cross sectional area of a semiconductor substrate formed in accordance with the present invention. This substrate is a silicon crystal in the (100) orientation that has been exposed to orientation-dependent etch to form tips on mesas 1 by selectively removing portions of the semiconductor substrate 3. These tips or mesas are provided with coating 2 of a metallic silicon carbide chrome or some equivalent wear resistant material to harden the surface of the tip 1. The coating 2 should be electrically conductive in order to provide a path from an integrated circuit on the substrate 3 through the tip 1 and coating 2 to some other device that would physically touch coating 2. After fabrication this semiconductor substrate 3 containing integrated circuits upon the substrate's surface may be positioned to contact other circuits using the tip 1 with coating 2 as the means to connect to an electrically conductive surface or bonding pad of another circuit device. It should be obvious to one skilled in the art that this semiconductor tip 1 and coating 2 can be used to provide electrical contact to other semiconductor substrate bonding pads or to printed circuit boards at certain metallic or electrically conductive areas.

Figure 2A:
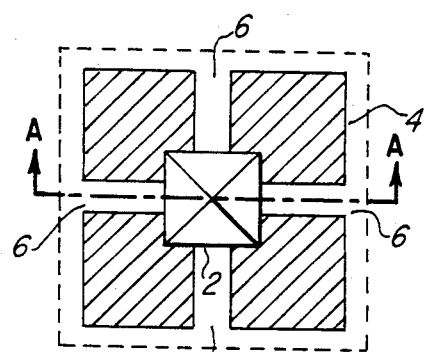
FIG. 2a is a top level view of a semiconductor substrate tip formed over a bridge structure in the semiconductor substrate.
Figure 2B:
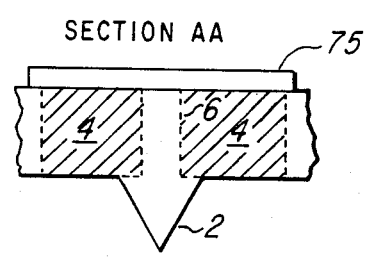
FIG. 2b is a cross sectional area AA view of FIG. 2a illustrating the bridge structure for the semiconductor substrate tip.

Since the tip 1 and coating 2 are required to come into physical contact with a surface, a structure illustrated in FIG. 2a is provided to allow for a vertical displacement of tip 1 and coating 2. FIG. 2a is a top level view of the spring structure for the surrounding area of the tip 1. From above, only the coating 2 is shown on substrate 3. The areas 4 denote portions where the substrate 3 has been etched to allow flexing of the bridge areas, such as 6. The four bridge areas, 6, allow for the vertical flexing and movement of the tip 1 and coating 2 relative to the substrate 3 in a manner that allows for contact with some other surface where the other surface is not topographically level. FIG. 2b illustrates a cross section (AA) view of the bridge structure in FIG. 2a. A silicon carbide film can be used to provide backup support 75.

Figure 3:
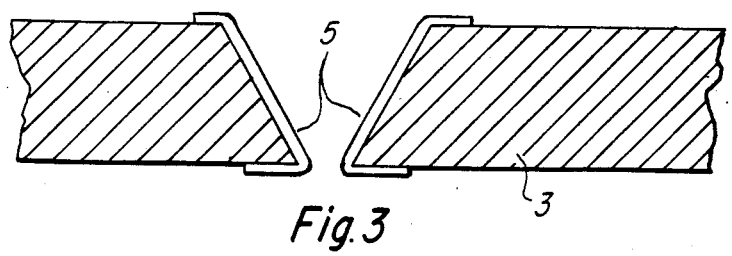
FIG. 3 is a cross sectional view of a semiconductor substrate illustrating a conductive hole in the substrate.

FIG. 3 illustrates another feature of the invention using the orientation-dependent etching to form a hole in the substrate 3 followed by the metallization 5 around the hole. This provides for electrical conductivity from one surface of the substrate 3 to another surface of the substrate 3. In a preferred embodiment, integrated circuits may be formed on one side of the substrate 3 using the metallization layers 5 to provide electrical continuity to a contact formed on the opposite side of the substrate.

FIGS. 4(a–o) illustrates the process steps that form the mesas 1 and hole areas such as shown in FIG. 3 using the orientation-dependent etch. FIG. 4a illustrates the first step in the process which is the by placing of a thermal oxidation layer 7 upon a substrate 3 which is a 3 inch diameter silicon substrate orientated (100) doped P− at 10–20 ohms/c. The thermal oxidation layer 7 is about 12,000 Angstroms thick. A second oxidation layer also shown as layer 7 is applied using plasma reactive deposited oxide. This second oxide layer is about 3,000 Angstroms thick for a total thickness of 15,000 Angstroms of oxide. The second step in this fabrication is illustrated in FIG. 4b which shows the opening areas 8 and the remaining oxide layers 10 that are defined by photolithography step using KMER patterning for oxide removal to define the top of mesas 10. The areas 10 are the actual definition of the mesa in the substrate 3. An example of an etchant used in this step is a mixture of 250 milliliters of ethylene-diamine and 45 grams of pyrocatechal with 120 milliliters of water. FIG. 4c illustrates the formation of the mesas. The mesas 9 are formed in the substrate 3 by an orientation dependent etch to a depth determined by the etch time For the etchant above, the etch rate is approximately 1 micron per minute at 100° C. or 25.4 minutes per millimeter. Therefore for a mesa height of about 3 millimeters, the substrate should be exposed to the etchant for 76 minutes. The oxide masking for the mesas 10 remain to protect the area underneath the mask layer 10 from the orientation-dependent etch. Note that in this embodiment, the tips are formed as mesas instead of sharp pointed tips 1 as shown in FIG. 1. To form a sharp tip, such as 1 in FIG. 1, the mesa mask 10 would be of very small width. The etchant would be allowed to remain until it had undercut beneath the mesa mask forming the tip. However, in this embodiment the mesa plateau areas defined by oxide 10 is used to form a permanent bond between substrate 3 and a substrate to be joined in the future.

Figure 4A:
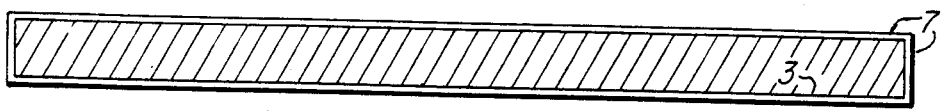
FIG. 4a is a cross sectional view of a semiconductor substrate with an oxide layer.
Figure 4B:
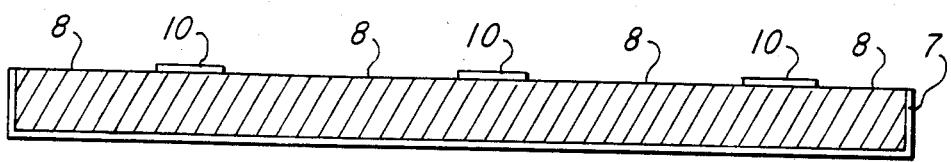
FIG. 4b is a cross sectional view of a semiconductor substrate with a patterned oxide layer.
Figure 4C:
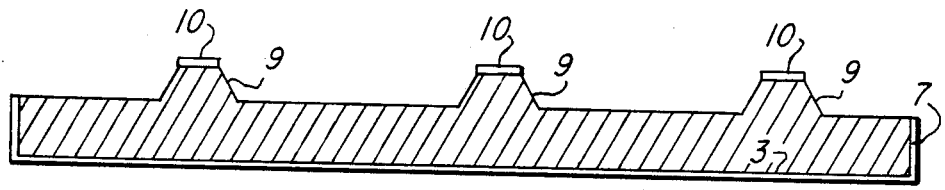
FIG. 4c is a cross sectional view of a semiconductor substrate with mesas formed.
Figure 4D:
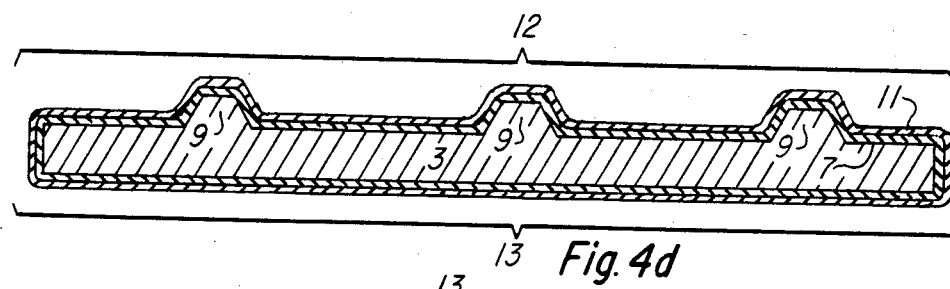
FIG. 4d is a cross sectional view of a semiconductor substrate with layers formed over the semiconductor substrate surface.
Figure 4E:
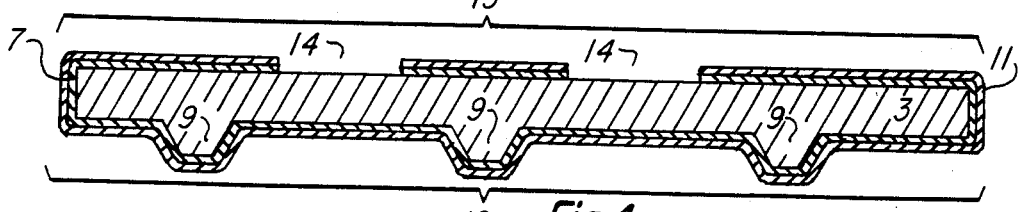
FIG. 4e is a cross sectional view of a semiconductor substrate with layers patterned on the semiconductor substrate surface.

The formation of the metallization connection between the two surfaces as illustrated in FIG. 3 will be illustrated in FIG. 4d through 4n. In FIG. 4d an additional layer 11 is applied to the thermal oxide and plasma oxide layer 7. This additional layer 11 comprises silicon nitride, Si3N4 and is 1400 Angstroms thick. This nitride layer surrounds the substrate 3 on both the mesas side 12 and the plane side 13. In FIG. 4e, the substrate has been turned upside down such that the mesas side 12 is now facing downward and the flat side 13 is facing upward. FIG. 4e also illustrates a photolithographic etching of openings 14 on surface 13 of the substrate 3.

Figure 4F:
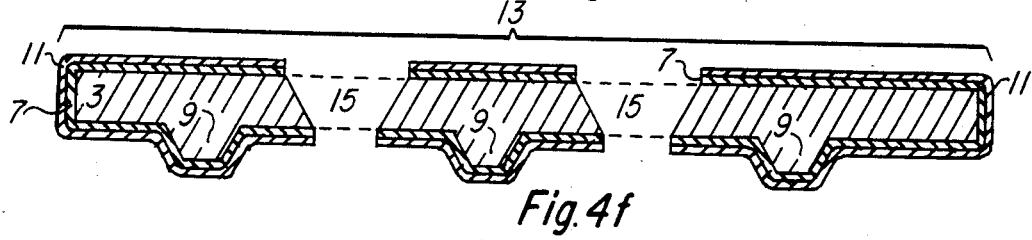
FIG. 4f is a cross sectional view of a semiconductor substrate illustrating holes formed in the semiconductor substrate.
Figure 4G:
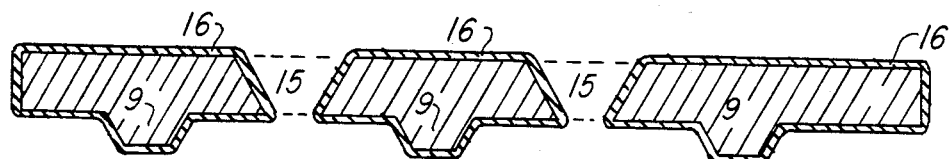
FIG. 4g is a cross sectional area of a semiconductor substrate illustrating the deposition of a layer through the holes and around the surface of the substrate.
Figure 4H:
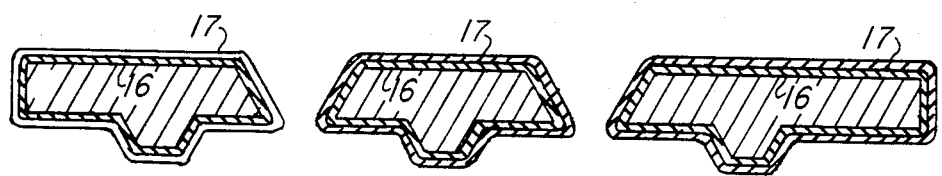
FIG. 4h is a cross section of a semiconductor substrate illustrating the deposition of two layers through the holes and over the surface of the semiconductor substrate.
Figure 4I:
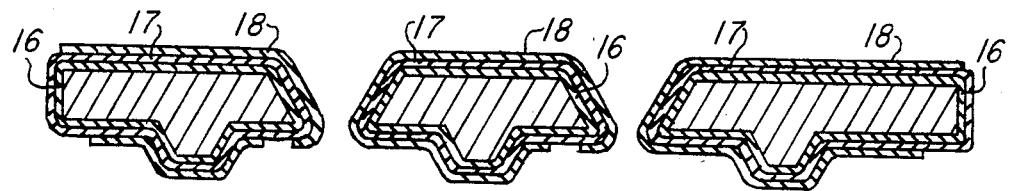
FIG. 4i is a cross section of a semiconductor substrate illustrating the partial formation of one layer over two other layers on a semiconductor substrate.
Figure 4J:
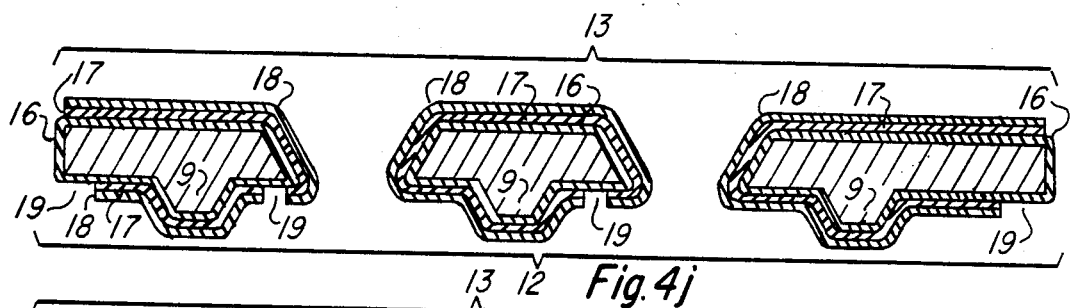
FIG. 4j is a cross section of a semiconductor substrate illustrating the patterning of layers on the semiconductor substrate surface.
Figure 4K:
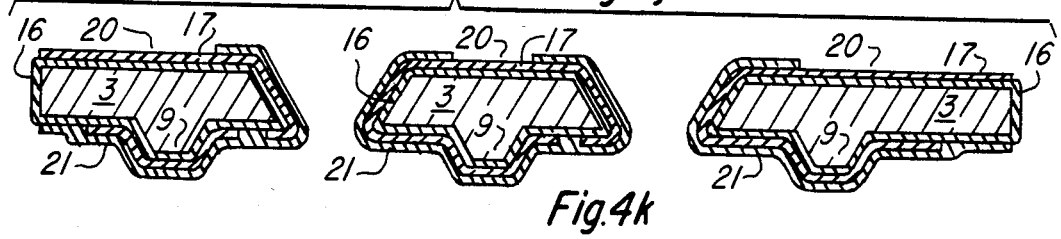
FIG. 4k is the cross section of a semiconductor substrate illustrating the selective deposition of a photoresist on the semiconductor surface.
Figure 4L:
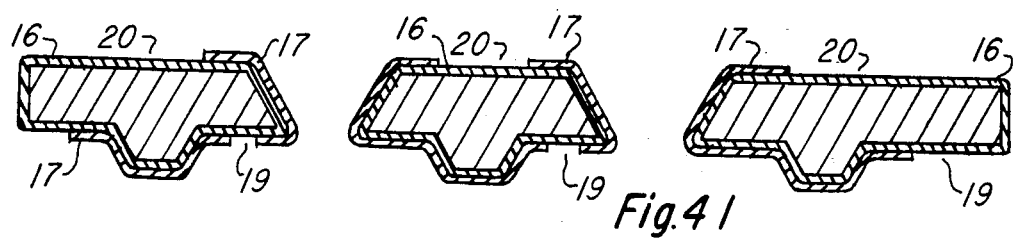
FIG. 4l is a cross section of a semiconductor substrate illustrating the patterning of the layer upon the semiconductor surface.
Figure 4M:
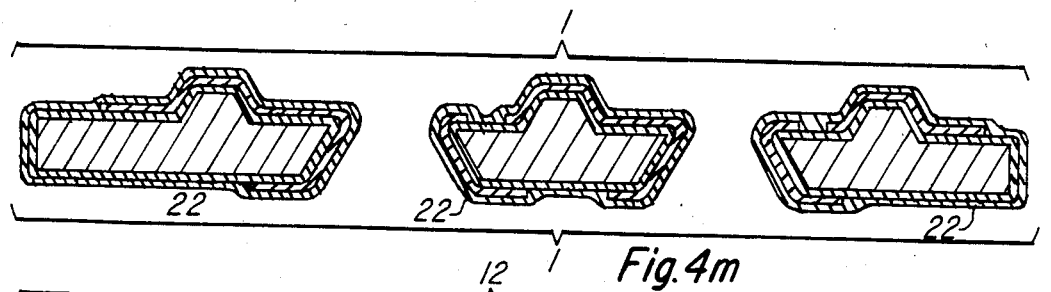
FIG. 4m is a cross section of a semiconductor surface illustrating the formation of a layer over selectively patterned layers on the semiconductor substrate surface.
Figure 4N:
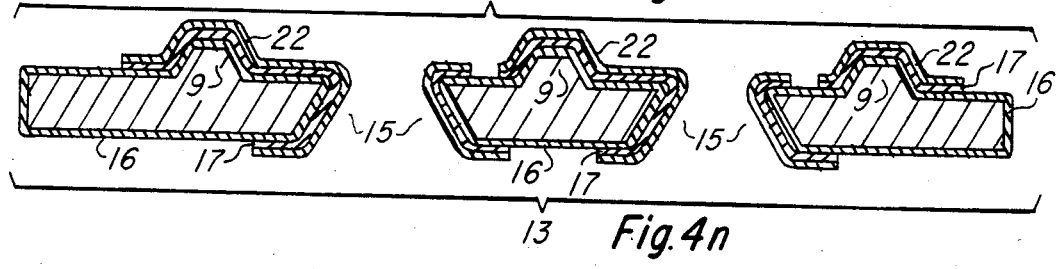
FIG. 4n illustrates cross section of a semiconductor substrate illustrating the formation of metal layers on the semiconductor substrate.
Figure 4O:
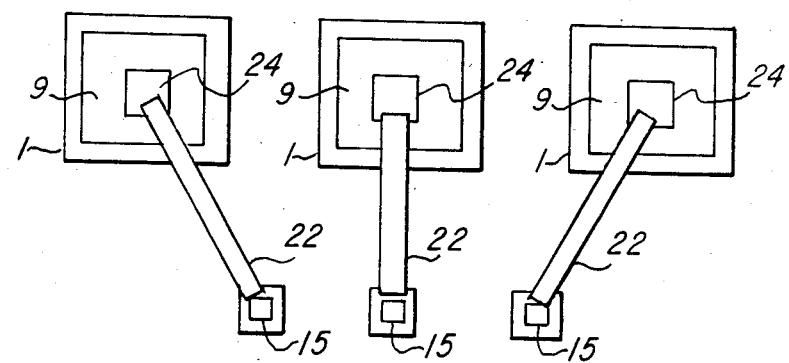
FIG. 4o is the top level of the semiconductor substrate illustrating the formation of holes and mesas in the semiconductor substrate.
Figure 4O:
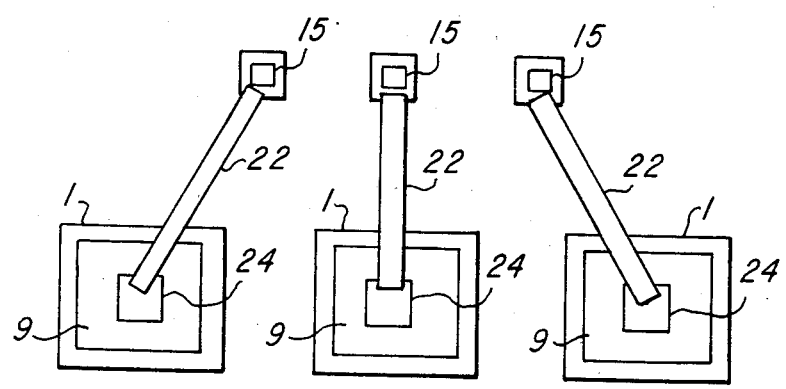

These areas 14 will define holes on side 13. These areas 14 are provided by the selective removal of the silicon nitride 11 and oxide 7 layers. A plasma etch is used to remove the silicon nitride and standard etch is used to remove the oxide. In FIG. 4f the holes 15 are fabricated by applying an orientation etch on the surface 13. This etch is allowed to remove substrate 3 until the holes 15 are formed completely through substrate 3 as shown. FIG. 4g illustrates the removal of the silicon nitride layer 11 and the oxide layer 7 from the semiconductor substrate 3 and a regrowth of 10,000 Angstroms of oxide. FIG. 4h illustrates a deposition of a polysilicon doped with phorphorous to about 40 ohms per square. This additional layer 17 is applied to a thickness of 6,000 angstroms. In FIG. 4i a photoresist layer 18 is added to the substrate 3 with oxide layer 16 and the doped polysilicon layer 17. In FIG. 4j, the doped polysilicon layer 17 is selectively removed by an etchant from areas 19 as shown. These steps are to define areas of electrical continuity between the surface area 13 and the mesas 9 on surface area 12. In FIG. 4k, an additional photoresist layer 21 is used to protect the mesa side 12 while areas 20 are being etched. After the photoresist 21 is applied, the polysilicon layer 17 on side 13 is removed by etching as shown in FIG. 4l. The remaining oxide layer 16 is left intact. The photoresist layer 21 is then removed, resulting in the structure illustrated in FIG. 4l. Metal is then deposited on both sides 13 and side 12 to form a metal layer 22 as shown in FIG. 4m. The metal layer at 22 is then patterned in the same manner as procedures in FIGS. 4i through 4l. Note that the substrate has been reversed as shown in FIG. 4m such that side 12 is now the top and side 13 is now the bottom. After the layer 22 is patterned, it appears as shown in FIG. 4n. Layer 22 now provides electrical continuity between the mesas 9 on side 12 and side 13 through the hole areas 15. A top view of the substrate 3 is illustrated in FIG. 4o, the top view being side 12. The metal interconnection 22 interconnects the mesa top flat portion 24 of mesa 9 coated by a coating 1 which is electrically conductive to the hole 15. Therefore, the mesa area 24 is electrically common with the reverse of the substrate not shown and integrated circuits fabricated on one side of the substrate can be interconnected with the opposite side.

Figure 5:
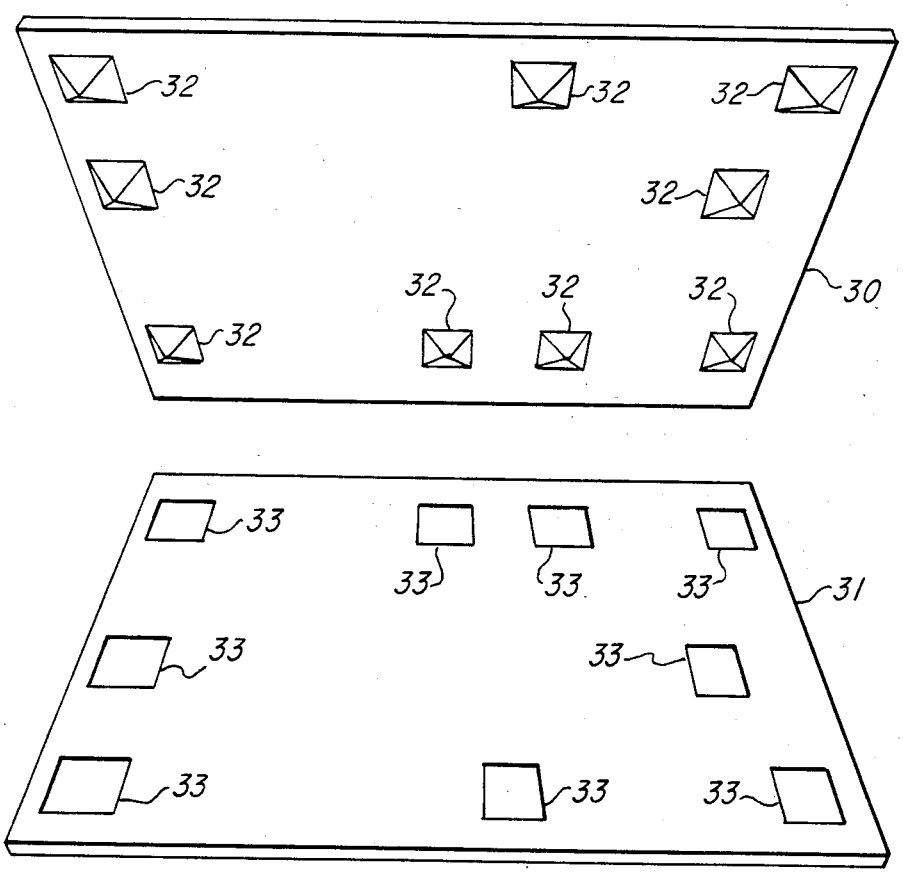
FIG. 5 is a view of a first semiconductor substrate with mesas formed to come into contact with the bonding pads of a second semiconductor substrate.

FIG. 5 illustrates one application of the invention using the tips 1. FIG. 5 is an illustration of a probe 30 above a semiconductor device 31 under test. The probe 30 contains several tips 32 located to come in contact with bonding pads on the device 31 under test. The purpose of the probe is to provide an electrical test interface to a semiconductor device under test. By using a semiconductor probe 30 there is no requirement for probe needles. This approach becomes more advantageous as circuits becomes smaller faster and individual circuit chips contain additional bonding pads that require testing. Since the tips 32 are mounted in a manner illustrated in FIG. 2a and 2b, the probe 32 can be positioned over the device 31 under test and make contact with the bonding pads on this device 31 despite topological variations in the surface of device 31. It should be noted that the structure in FIG. 2a and 2b may not be required. The use of the metal plated holes as illustrated in FIG. 4 will allow probe 30 to contain semiconductor integrated circuits on the opposite side, not shown, of probe 30 to provide for signal processing of the test signal by probes 32. In addition, test logic may be contained on probe 30 to perform all types of test for the device 31 under test.

When a multiprobe 30, as illustrated in FIG. 5, is used to test semiconductor devices, a frequent problem that arises is the presence of oxide upon the bonding pads of the device under test. This oxide can act as an insulator between the bonding pad and the multiprobe tip 32 preventing electrical contact. To solve this problem, a vibrator, such as a piezoelectric vibrator, can be mechanically coupled to the multiprobe 30. This vibrator will vibrate the multiprobe tips 32, causing these tips 32 to penetrate the oxide layer to make electrical contact.

Figure 6:
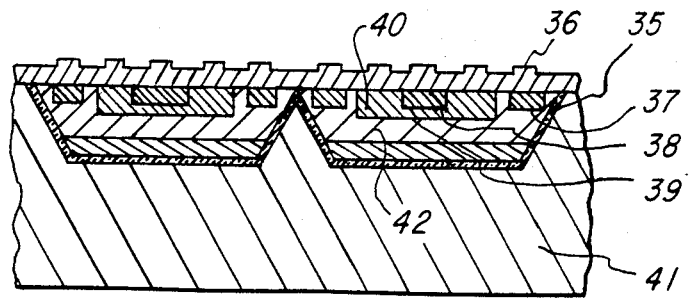
FIG. 6 is a cross sectional area of a semiconductor substrate illustrating the dielectric isolation of the electric circuits contained on the surface of the semiconductor substrate.

The probe tips can be isolated from the semiconductor substrate in a manner illustrated in FIG. 6. FIG. 6 actually illustrates a transistor isolated from a semiconductor substrate 41. The substrate includes a metallization layer 36 on top of the substrate 41. This metallization layer 36 could include a probe. Silicon dioxide 35 provides a barrier. Inside the barrier there is an N+ collector contact 37 adjacent to an N+ emitter 38 positioned in a P− base 40. The combination is located over a P region 42. The silicon dioxide layer 35 provides a dielectric isolation of the device from the polycrystalline substrate 41. Likewise, in the application of the probe tips 33 in FIG. 35 or the mesas 9 in FIG. 4, dielectric isolation can be used to provide isolations from the semiconductor substrate for the mesas or tips.

The multiprobe 30 as illustrated in FIG. 5 may be used with existing automatic wafer prober devices such as the Teledyne TAC PR-100. The prober is a production machine used to automatically place a semiconductor device of a wafer (or semiconductor slide) in a position to be tested using test probes. The wafer is placed on the chuck of the prober which moves precisely in X and Y directions (of a horizontal plane relative to the wafer) to place the semiconductor device to be tested underneath the probes. The chuck is then raised until the probes make contact with the device. In this manner, each semiconductor device on the wafer is tested. By using the solid state multiprobe 30 in place of the single probes, high density complex integrated circuits containing many bonding pads may be tested without hving to position single probe tips for each of the many bonding pads. In addition, in situations where the number of single probes required would become so numerous as to be impractical, the multiprobe 30 may be the only way to test the semiconductor device.

Figure 7:
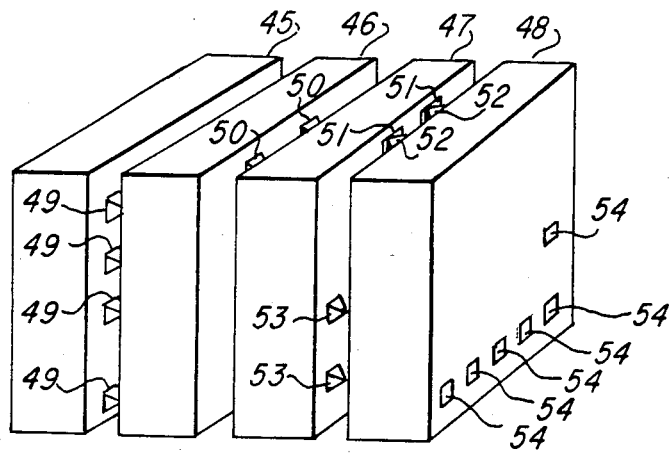
FIG. 7 is an asymmetric view illustrating the interconnection of four semiconductor substrates.

FIG. 7 illustrates an embodiment of the invention where four semiconductor substrates, 45, 46, 47 and 48, are placed together in a manner that results in electrical interconnection of the four substrates, 45, 46, 47 and 48. Substrate 45 contains several contact tips 49, which come in contact with pads upon the left surface of substrate 46 (not shown). Substrate 46 contains tips 50 which are in contact with the left side of the substrate 47. Substrate 47 again contains tips 53 which come in contact with contact pads on substrate 48. In addition, substrate 47 contains contact pads 51 which receive electrical signals from the tips 52 from substrate 48. Substrate 48 in addition contains several contact pads 54 for wire bonding to connect to packaging pins. In this arrangement, power devices would be placed on the outside to allow heat to radiate outward. The use of heat sinking materials that surround the semiconductor substrate sides could remove heat from the semiconductor substrates. The use of the substrate tips formed by the orientation-dependent etching steps is advantageous because it eliminates the requirement for wire bonding or pin contacts between the substrates and allows for a denser packing of semiconductor circuits together without the disadvantage of an increase in a single semiconductor chip size.

Figure 8:
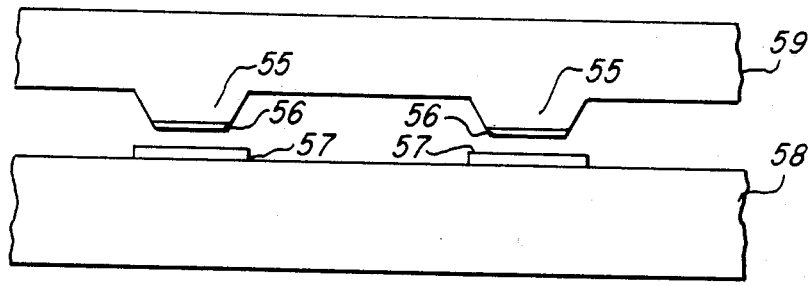
FIG. 8 is a cross sectional view of two semiconductor substrates illustrating the bonding of the two substrates.

FIG. 8 illustrates the bonding between the substrates in FIG. 7. In FIG. 8, substrate 59 contains tips 55 which are formed into mesas with a flat area 56 that contains electrically conductive bonding material, such as solder. Substrate 59 is to be placed in contact with substrate 58 at elevated temperature bonding the mesas 55 with coating 56 to bonding pads 57 which are metallic bonding pads on the surface of substrate 58. Bonding pads 57 will receive the coatings 56 in a manner that results in a fixed bond between the mesa areas 55 and the bonding pads 57. With bonding made in this manner and with the techniques previously discussed, integrated circuit elements on either side of substrates 58 and 59 may be collectively interconnected.

Figure 9:
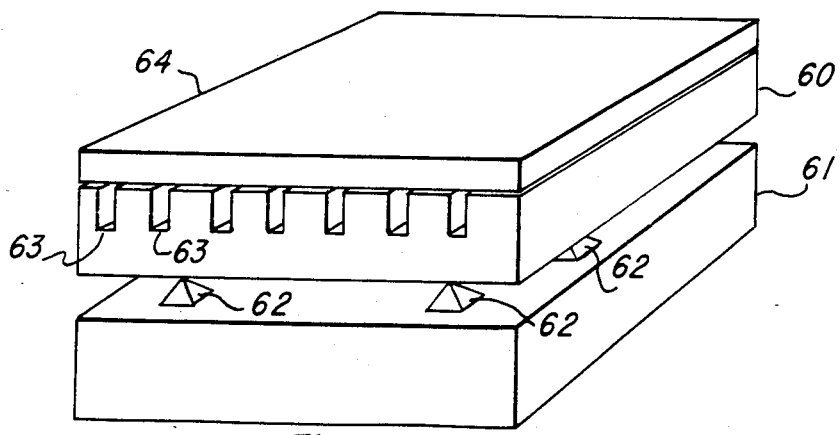
FIG. 9 is an asymmetric of two semiconductor substrates illustrating the bonding between the two substrates and the cooling structure for the top semiconductor substrate.

When combining several integrated circuits in this manner, cooling may become a problem. That is, as the circuit density becomes greater, the requirement to remove heat from the substrate becomes greater. One possible solution to this problem would be a combination of semiconductor substrates in a structure illustrated in FIG. 9. Substrate 60 is formed using orientation-dependent etch to produce the channels 63 for the purpose of cooling. A cover plate 64 is placed on the top surface of substrate 60 and a coolant is circulated through the channels, such as 63. THis device was disclosed in the article, "High Performance Heat Sinking for VLSI", discussed in the background. In addition the semiconductor substrate 60 containing integrated circuits may also be interconnected with some additional integrated circuits on the semiconductor substrate 61 by means of the tips 62 making contact with bonding pads upon the bottom surface of substrate 60, not shown. Therefore the orientation-dependent etching technique may be used in two different ways on two different substrates to produce a cooling structure on one substrate and interconnection tips on a second substrate.

Figure 10:
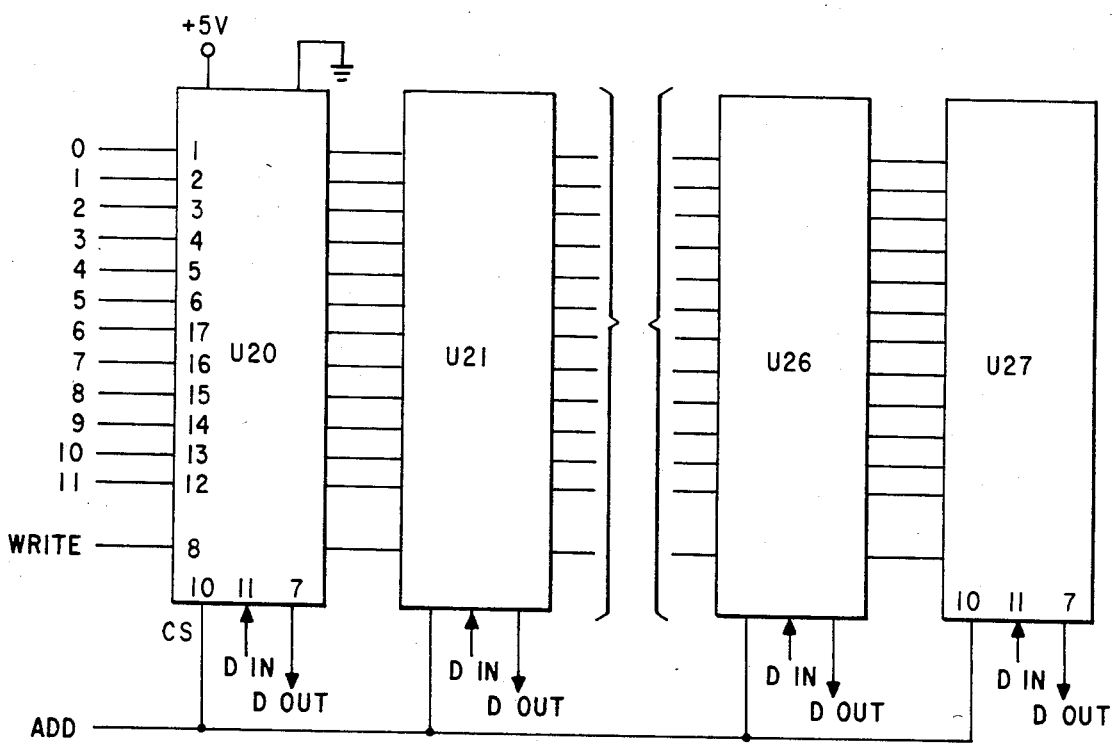
FIG. 10 is a block diagram illustrating the interconnection of several semiconductor memory chips.
Figure 11:
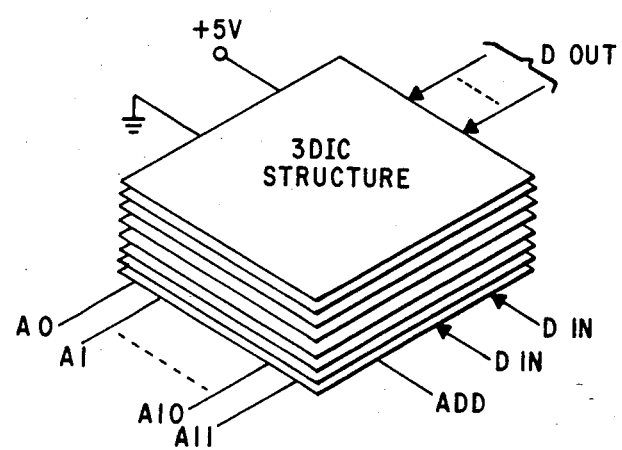
FIG. 11 is an asymmetric view illustrating the structural arrangement of a three-dimensional integrated circuit memory device.

One application of these techniques in illustrated in FIGS. 10 and 11. A typical semiconductor memory structure is schematically illustrated in FIG. 10. This schematic illustrates 8 4K×1 bit.random access memory chip packages interconnected. Note that the address lines A through A11 are common to chips U20 through U27. In addition each chip contains a 5 volt power input on pin 18 and a ground on pin 9. The power and ground interconnections are only shown for chip U20, but are also common to chips U21 through U27. In addition, chips U20 through U27 require a write input on pin 8, a data-in input on pin 11 and a data-out input on pin 7. The chip select signal is input on pin 10 and is common for all the 8 chips U20 through U27. This signal line marked Add selects this 8 chip bank to produce an 8 bit parallel output on the D-out lines or to provide a write into memory of 8 bits on the D-in line. The actual memory chips may be arranged as illustrated in FIG. 11 since the address lines A0 through A11 are common to all memory substrates or chips together with the 5 volt supply and the ground line and the chip select line Add. The data-in and data-out lines, however, are individual to each of the chips and therefore 8 separate data-in and 8 separate data-out lines must be provided. This can be accomplished by bringing the 8 lines to the top substrate surface or the bottom substrate surface using the techniques previously discussed. In FIG. 11 the data-out lines are brought to the top of the surface of the uppermost semiconductor substrate and the data-in lines are connected to the bottom surface of the bottom-most semiconductor substrate. The actual connection would be made by wire bonding onto bonding pads on these exposed surfaces. The connection of individual lines to the individual memory chip or substrate would be made using the mesa to bonding pad technique together with the metallization through the semiconductor substrate technique to provide electrical continuity from the bonding pad on the top surfae to the specific integrated circuit upon the substrate located below the top surface. In the manner a single semiconductor structure is provided that furnishes a 4K×8 bit parallel memory.

We claim:

1. A testing socket for electrical testing of devices, each having a substantially planar surface with an array of conductive pads disposed thereon comprising:
   (a) a holder for holding a said device in a fixed position;
   (b) a probe for contacting said device pads, said probe including a substantially planar semiconductor substrate with electrically conductive semiconductor projections integral with said substrate and disposed in an array corresponding to a mirror image of said array of pads; and
   (c) circuit means connected to said projections for testing of said device when said probe projections contact said pads.

2. The testing socket of claim 1, wherein:
   (a) said substrate is substantially single crystal silicon and said projections are characterized as formed of said crystal at least in part by orientation dependent etching.

3. The testing socket of claim 1, wherein:
   (a) said circuit is at least partially formed on said substrate.

4. The testing socket of claim 1, wherein:
   (a) at least one of said projections is insulated from the remainder of said substrate except for connection to said circuit.

5. The testing socket of claim 1, wherein:
   (a) said projections are formed in said substrate at flexible portions of said substrate.

6. The testing socket of claim 5, wherein:
   (a) said flexible portions are characterized by connection to the remainder of said substrate by bridges formed in said substrate.

7. The testing socket of claim 1, further comprising:
   (a) a vibrator for said probe, said vibrator characterized by vibration of said probe when in contact with said device pads for improved electrical contact.

8. The testing socket of claim 1, wherein:
   (a) said circuit includes test signal evaluators.

9. The testing socket of claim 8, wherein:
   (a) said circuit includes a display for the output of said test signal evaluators.

10. The testing socket of claim 1, wherein:
    (a) said circuit includes programmable test signal generators.

11. The testing socket of claim 1, wherein:
    (a) said projections include a wear-resistant conductive coating.

12. A probe for electrical contact to an array of pads comprising:
    (a) a substantially planar semiconductor substrate; and
    (b) electrically conductive semiconductor projections integral with said substrate and disposed on a surface of said substrate, said projections being arrayed in correspondence with said array of pads.

13. The probe of claim 12, wherein:
    (a) said substrate is substantially single crystal silicon and said projections are characterized by orientation dependent etching of said substrate.

14. The testing socket of claim 1 wherein said projections are of pyramidal shape.

15. The testing socket of claim 2 wherein said projections are of pyramidal shape.

16. The testing socket of claim 5 wherein said projections are of pyramidal shape.

17. The testing socket of claim 6 wherein said projections are of pyramidal shape.

18. The testing socket of claim 12 wherein said projections are of pyramidal shape.

19. The testing socket of claim 13 wherein said projections are of pyramidal shape.

20. The probe of claim 12, wherein:
    (a) said projections are formed in said substrate at flexible portions of said substrate.

21. The probe of claim 20, wherein:
    (a) said flexible portions are characterized by connection to the remainder of said substrate by bridges formed in said substrate.

22. The probe of claim 18, wherein:
    (a) said projections are formed in said substrate at flexible portions of said substrate.

23. The probe of claim 22, wherein:
    (a) said flexible portions are characterized by connection to the remainder of said substrate by bridges formed in said substrate.

24. The probe of claim 19, wherein:
    (a) said projections are formed in said substrate at flexible portions of said substrate.

25. The probe of claim 24, wherein:
    (a) said flexible portions are characterized by connection to the remainder of said substrate by bridges formed in said substrate.

26. The probe of claim 12 further including an electrically conductive wear resistive layer over said projections.

27. The probe of claim 13 further including an electrically conductive wear resistive layer over said projections.

28. The probe of claim 20 further including an electrically conductive wear resistive layer over said projections.

29. The probe of claim 21 further including an electrically conductive wear resistive layer over said projections.

30. The probe of claim 23 further including an electrically conductive wear resistive layer over said projections.

31. The probe of claim 15 further including an electrically conductive wear resistive layer over said projections.

32. The probe of claim 12 further including:
    (a) a vibrator for said probe, said vibrator characterized by vibration of said probe when in contact with said device pads for improved electrical contact therewith.

33. The probe of claim 13 further including:
    (a) a vibrator for said probe, said vibrator characterized by vibration of said probe when in contact with said device pads for improved electrical contact therewith.

34. The probe of claim 20 further including:

(a) a vibrator for said probe, said vibrator characterized by vibration of said probe when in contact with said device pads for improved electrical contact therewith.

35. The probe of claim 21 further including:
(a) a vibrator for said probe, said vibrator characterized by vibration of said probe when in contact with said device pads for improved electrical contact therewith.

36. The probe of claim 26 further including:
(a) a vibrator for said probe, said vibrator characterized by vibration of said probe when in contact with said device pads for improved electrical contact therewith.

37. The probe of claim 27 further including:
(a) a vibrator for said probe, said vibrator characterized by vibration of said probe when in contact with said device pads for improved electrical contact therewith.

38. The probe of claim 28 further including:
(a) a vibrator for said probe, said vibrator characterized by vibration of said probe when in contact with said device pads for improved electrical contact therewith.

39. The probe of claim 29 further including:
(a) a vibrator for said probe, said vibrator characterized by vibration of said probe when in contact with said device pads for improved electrical contact therewith.

* * * * *